United States Patent [19]

Stephani et al.

[11] Patent Number: 4,735,920
[45] Date of Patent: Apr. 5, 1988

[54] METHOD FOR STRUCTURING SILICON CARBIDE

[75] Inventors: Dietrich Stephani; Peter Lanig; Guenther Ziegler, all of Erlangen, Fed. Rep. of Germany

[73] Assignee: Siemens Aktiengesellschaft, Berlin and Munich, Fed. Rep. of Germany

[21] Appl. No.: 10,961

[22] Filed: Feb. 4, 1987

[30] Foreign Application Priority Data

Feb. 6, 1986 [DE] Fed. Rep. of Germany ....... 3603725

[51] Int. Cl.$^4$ ................. H01L 21/42; H01L 21/467
[52] U.S. Cl. ......................... 437/234; 148/DIG. 148; 156/633; 156/657
[58] Field of Search ............ 148/DIG. 148; 156/628, 156/633, 657; 437/234

[56] References Cited

U.S. PATENT DOCUMENTS 3,398,033 8/1968 Haga et al. .............................. 156/17
3,510,369 5/1970 Ernick et al. ..................... 156/628 X
4,595,453 6/1986 Yamazaki et al. .................. 156/643

FOREIGN PATENT DOCUMENTS 0008348 3/1980 European Pat. Off. .
0012327 6/1980 European Pat. Off. .
2730819 1/1979 Fed. Rep. of Germany .
2000372 1/1979 United Kingdom .
1566072 4/1980 United Kingdom .

OTHER PUBLICATIONS

Kushner, J. Appl. Phys. 53 (4), Apr. 1982, pp. 2923–2938.

Munch et al, "Silicon Carbide Blue-Emitting Diodes Produced by Liquid-Phase Epitaxy", Solid State Electronics, vol. 121, (1978), pp. 1129–1132.

Chang et al, "Novel Passivation Dielectrics–The Boron or Phosphorous Doped Hydrogenated Amorphous Silicon Carbide Films", J. Electrochemical Society, Feb. 1985, pp. 418–422.

Primary Examiner—Olik Chaudhuri
Attorney, Agent, or Firm—Hill, Van Santen, Steadman & Simpson

[57] ABSTRACT

A method for structuring silicon carbide by photolithography and plasma etching wherein a substrate of silicon carbide is covered on a flat side with a structured silicon layer, and the plasma etching is then carried out with a gaseous mixture of a halogenated hydrocarbon and oxygen, the oxygen being present in an amount of at least 40% and preferably 70 to 95% by volume.

6 Claims, 1 Drawing Sheet

METHOD FOR STRUCTURING SILICON CARBIDE

BACKGROUND OF THE INVENTION

1. Field of the Invention

The present invention is in the field of etching silicon carbide by plasma etching with a mixture of halogenated hydrocarbon and relatively high amounts of oxygen.

2. DESCRIPTION OF THE PRIOR ART

As is known, silicon carbide is suitable for use as a semiconductor for blue-colored light-emitting diodes. The use of silicon carbide for microcomponents, for example, for field effect transistors or semiconductor sensors is met with technological difficulties. Although liquid-phase epitaxy is possible with high dopings at high temperatures, it is not well suited for low dopings in the range from about $10^{16}$ cm$^{-3}$ to $10^{17}$ cm$^{-3}$ at room temperatures. Unlike many other semiconductors, there is no complete dissociation at room temperature, and the imperfection concentrations are also correspondingly higher at higher temperatures. Planar technology cannot be used without modification because the diffusion temperature of about 2000° C. is relatively high and the risk of decomposing the surface layers as well as the materials transport in transport reactions is very possible at these temperatures. Moreover, the covering of silicon oxide or silicon dioxide usually employed for structuring in such planar technology is not suitable at these temperatures (see the article by Kurzinger in Solid State Electronics, Vol. 21, page 1129). Although a plurality of blue-light diodes can be manufactured as mesa structures and later severed with a diamond saw, these structures are likewise manufactured at a relatively high temperature above 1000° C. with a gas etchant which contains chlorine and a small proportion of oxygen. (See the aforementioned article in "Solid State Electronics", pages 1129-1132).

It is known that a plasma etching of amorphous silicon carbide can be performed in a gas mixture of carbon tetrafluoride $CF_4$ and oxygen $O_2$ (J. Electrochem. Soc., Solid-State Sc. and Techn., February 1985, pages 418-422).

SUMMARY OF THE INVENTION

The present invention provides a method for structuring crystalline silicon carbide which enables etching to be performed at an economical rate and at a relatively low temperature.

The invention is based upon the discovery that a mixture of a halogenated hydrocarbon and oxygen having a relatively high proportion of oxygen yields an etching rate for silicon that is significantly lower than that for silicon carbide so that selective etching between the two can be carried out. The silicon carbide substrate is first covered with a structured layer of silicon and then subjected to plasma etching in the presence of a gaseous mixture of a halogenated hydrocarbon and oxygen, the mixture containing at least 40% by volume oxygen. The preferable oxygen content is in the range from 70 to 95%, and more preferably, at about 75 to 90% by volume. Although the covering layer composed of silicon which is provided for the structuring is likewise eroded during the plasma etching, this silicon etching occurs at a significantly lower rate.

BRIEF DESCRIPTION OF THE DRAWINGS

For a further explanation of the invention, reference is made to the attached sheet of drawings in which.

DESCRIPTION OF THE PREFERRED EMBODIMENTS

Figure 1:
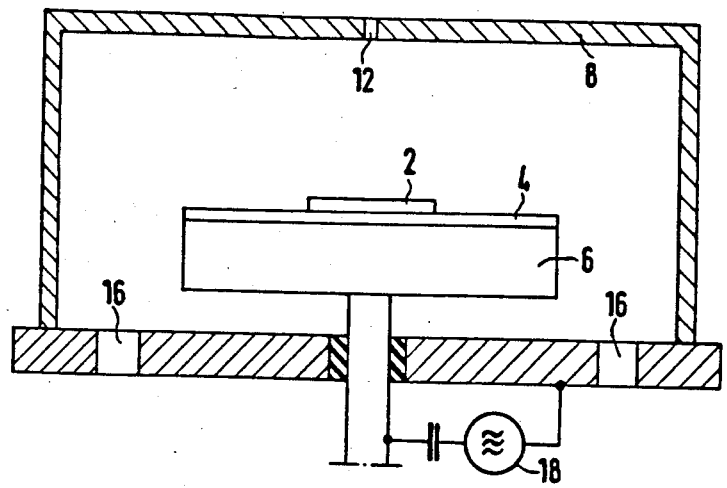
FIG. 1 shows somewhat schematically an arrangement of apparatus which can be used to perform the method.

In a known apparatus embodiment for reactive ion etching shown in FIG. 1, a substrate 2 composed of silicon carbide in the hexagonal 6H-modification is positioned on a covering 4 of graphite, glass, a vitrified material, or silicon dioxide $SiO_2$ forming a cathode 6. A receptor 8 serves as the anode and is provided with a gas admission inlet 12. A base plate 14 supports the receptor 8 in a vacuum-tight relation and is at the anode potential. Two vacuum connections 16 are provided in the base plate 14 with the plate being electrically insulated from the cathode 6. A high-frequency generator 18 is connected between the anode 8 and the cathode 6.

Reactive ion etching of the substrate can be performed, for example, with a high-frequency power level of 300 Watts at a frequency of 13.56 MHz which corresponds to a power density of 0.6 W/cm$^2$ with reference to the surface of the cathode 6. The flow of a gas mixture composed of carbon tetrafluoride $CF_4$ and oxygen $O_2$ may conveniently be held constant at, for example, 200 sccm. A pressure of about 23 to 25 Pa is thus established. With a volume of about 10 liters in the receptor 8, a mean gas dwell time of about 0.7 second is achieved.

Figure 2:
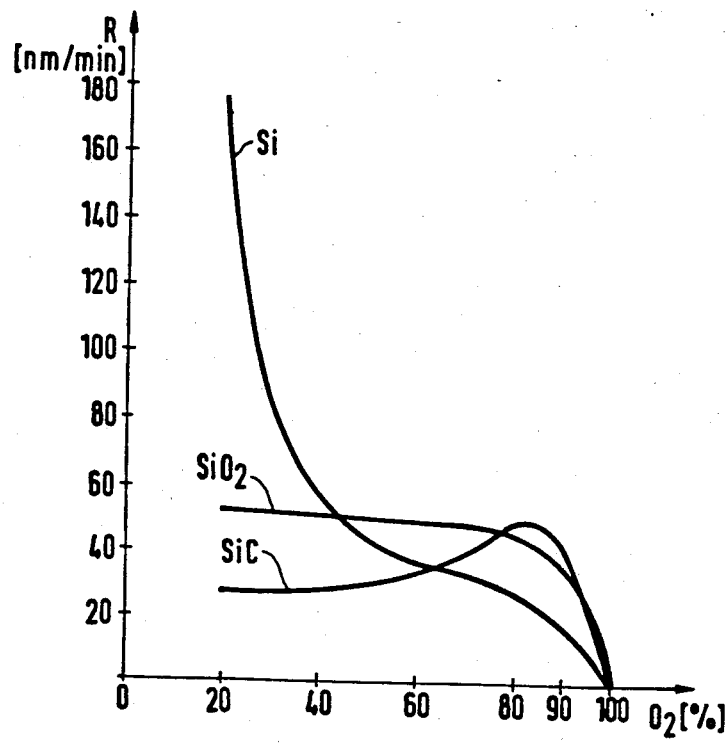
FIG. 2 is a diagram showing the dependence of the etching rate on the oxygen constituent of the gas.

The diagram of FIG. 2 compares the etching rates of silicon, silicon dioxide, and silicon carbide dependent on the oxygen concentration in the gas flow at a temperature of the substrate not significantly above room temperature. It may be seen from the diagram that the etching rate of silicon becomes lower than the etching rate of silicon carbide when the oxygen concentration exceeds about 64%. With an oxygen concentration of about 70 to 95%, the etching rate of silicon is significantly lower than that of silicon carbide and with an oxygen content of about 75 to 90%, the etching rate of silicon carbide is about twice as high as the etching rate of silicon. These ranges can shift depending upon the change in temperature of the cathode 6 and thus of the substrate 2.

Figure 3:
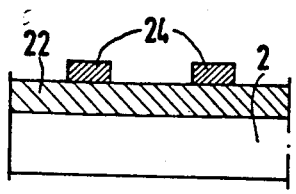
FIGS. 3 to 5 schematically show various method steps for structuring the silicon carbide in accordance with the present invention.

Structuring of silicon carbide in accordance with the present invention proceeds with covering the substrate 2 of silicon carbide with an intermediate layer 22 of silicon as shown in FIG. 3. The surface of the silicon is provided with a structured photoresist mask 24.

Figure 4:
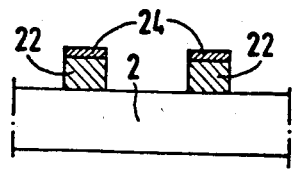

As shown in FIG. 4, the structure of the photoresist mask 24 is then transferred onto the intermediate silicon layer 22, for example, by reactive ion etching having a low percentage of oxygen. At most, the oxygen concentration in this step should be about 30% by volume, and more particularly, it is preferred to use a gas mixture composed of 85% carbon tetrafluoride and about 15% oxygen.

Figure 5:
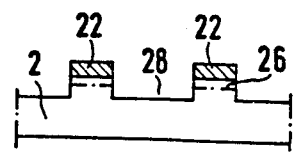

Subsequently, the structure of the intermediate silicon layer 22 is transferred into the substrate 2 as shown in FIG. 5 by reactive ion etching with a high oxygen proportion such as about 70 to 95% oxygen and more preferably with a proportion of about 77 to 87% oxygen. The intermediate silicon layer 22 is thereby eroded with a significantly lower etching rate than the silicon carbide of the substrate 2.

One of the advantages of the method of the invention consists in the fact that a trench etching can be carried out in a simple manner. In conjunction with multi-layer component which is not entirely shown in FIG. 5 for reasons of simplification, with a pn-junction 26 indicated by the dot-dash lines in FIG. 5 under the intermediate silicon layer 22, the anisotropic reactive ion etching has an etching direction proceeding essentially perpendicular to the flat sides of the overall arrangement. This produces a trench 28 which, for example, can serve as insulation between electrically active regions, particularly for the electrical separation of the individual components in a unit having a plurality of elements in the form of a mesa.

To remove the intermediate layer 22 in a simple way, moreover, the oxygen content can be reduced, for example, to less than 20% as may be seen from the diagram of FIG. 2. As a consequence of the resistance of the material of the substrate 2, it is also possible to remove the intermediate layer 22 without residue by wet-etching.

It should be evident that various modifications can be made to the described embodiments without departing from the scope of the present invention.

We claim as our invention:

1. A method of structuring silicon carbide which comprises:
   providing a planar substrate of silicon carbide,
   covering one flat surface of said substrate with a layer of silicon,
   etching said layer of silicon to provide a structured silicon mask, and
   plasma etching the underlying substrate through said structured silicon mask employing a gaseous mixture of a halogenated hydrocarbon and oxygen, said oxygen constituting at least 40% by volume of said mixture whereby said substrate of silicon carbide is etched more rapidly than said structured silicon mask.

2. A method according to claim 1 wherein said mixture contains from 70 to 95% by volume oxygen.

3. A method according to claim 1 wherein said halogenated hydrocarbon is carbon tetrafluoride.

4. A method according to claim 2 wherein said halogenated hydrocarbon is carbon tetrafluoride.

5. A method according to claim 1 wherein said silicon carbide is the hexagonal modification 6H-SiC 6. A method of structuring a silicon carbide substrate which comprises:
   applying a layer of silicon over said substrate,
   applying a resist mask over said substrate,
   plasma etching said substrate through said mask using a mixture of carbon tetrafluoride and oxygen containing not more than 30% by volume oxygen to reproduce the pattern of said resist mask in a silcon mask and,
   thereafter plasma etching the substrate through said silicon mask with a mixture of carbon tetrafluoride and oxygen containing at least 40% by volume oxygen.

* * * * *